United States Patent
Shepard, Jr.

(10) Patent No.: US 6,406,760 B1
(45) Date of Patent: Jun. 18, 2002

(54) DIAMOND FILM DEPOSITION ON SUBSTRATE ARRAYS

(75) Inventor: Cecil B. Shepard, Jr., Laguna Niguel, CA (US)

(73) Assignee: Celestech, Inc., Irvine, CA (US)

(*) Notice: Subject to any disclaimer, the term of this patent is extended or adjusted under 35 U.S.C. 154(b) by 0 days.

(21) Appl. No.: 09/618,225

(22) Filed: Jul. 18, 2000

Related U.S. Application Data (62) Division of application No. 08/870,604, filed on Jun. 6, 1997, now Pat. No. 6,173,672.
(60) Provisional application No. 60/019,472, filed on Jun. 10, 1996.

(51) Int. Cl.$^7$ ............................................. C23C 16/00
(52) U.S. Cl. .................................... 427/577; 427/249.8
(58) Field of Search ............................. 427/577, 249.8

(56) References Cited

U.S. PATENT DOCUMENTS

| | | | |
|---|---|---|---|
| 3,845,739 A | 11/1974 | Erhart et al. | 118/49.1 |
| 4,292,342 A | 9/1981 | Sarma et al. | 427/34 |
| 4,401,054 A | 8/1983 | Matsuo et al. | 118/723 |
| 4,471,003 A | 9/1984 | Cann | 427/34 |
| 4,487,162 A | 12/1984 | Cann | 118/723 |
| 4,505,947 A | 3/1985 | Vukanovic et al. | 427/34 |
| 4,507,588 A | 3/1985 | Asmussen et al. | 315/39 |
| 4,585,668 A | 4/1986 | Asmussen et al. | 427/38 |
| 4,596,718 A | 6/1986 | Gruner | 427/34 |
| 4,630,566 A | 12/1986 | Asmussen et al. | 118/50.1 |
| 4,691,662 A | 9/1987 | Roppel et al. | 118/50.1 |
| 4,728,863 A | 3/1988 | Wertheimer | 315/111.21 |
| 4,767,608 A | 8/1988 | Matsumoto et al. | 427/34 |
| 4,853,250 A | 8/1989 | Boulos et al. | 118/723 IR |
| 4,913,090 A | 4/1990 | Harada et al. | 118/724 |
| 4,958,591 A | 9/1990 | Yamazaki | 118/723 |
| 4,987,002 A | 1/1991 | Sakamoto et al. | 427/34 |
| 4,989,543 A | 2/1991 | Schmitt | 118/723 |
| 4,998,968 A | 3/1991 | Misumi | 118/723 |
| 5,063,031 A | 11/1991 | Sato | 422/245 |
| 5,068,871 A | 11/1991 | Uchida et al. | 373/37 |
| 5,094,878 A | 3/1992 | Yamamoto et al. | 427/37 |
| 5,104,634 A | 4/1992 | Calcote | 423/446 |

(List continued on next page.)

FOREIGN PATENT DOCUMENTS

| | | |
|---|---|---|
| EP | 0012440 | 6/1980 |
| EP | 165565 | 12/1985 |
| JP | 59-21026 | 2/1984 |
| JP | 59-43861 | 3/1984 |
| JP | 63-289926 | 11/1988 |
| JP | 01-242141 | 9/1989 |
| JP | 01-312008 | 12/1989 |
| JP | 02-60103 | 2/1990 |
| JP | 02-167891 | 6/1990 |

OTHER PUBLICATIONS

Goldfarb et al., "Deposition of Thin Films and Coatings by Atmospheric Pressure Vapor Plasma Jet", Plasma Chemistry and Plasma Processing, vol. 9, Nr. 1, Suppl., pp. 195S–206S, Mar., 1989.

Derwent Publications, JP1157498, 1989.

Sasaki et al., "New Diamond Science and Technology", Proceedings of the Second International Confernece, pp. 485–490, 1991.

Primary Examiner—Thi Dang
(74) Attorney, Agent, or Firm—Martin Novack (57) ABSTRACT

A method is disclosed for depositing diamond film on a plurality of substrates, which comprises the steps of: providing a plasma beam containing atomic hydrogen and a carbonaceous component; providing a plurality of substrates, each of the substrates having a deposited surface, the substrates being arranged such that the beam impinges successively on a deposition surface of a first substrate and then on a deposition surface of a second substrate, the deposition surfaces of the first and second substrates being oriented with respect to each other at a non-zero angle.

18 Claims, 7 Drawing Sheets

U.S. PATENT DOCUMENTS

| | | | |
|---|---|---|---|
| 5,108,779 A | 4/1992 | Gasworth | 427/39 |
| 5,132,105 A | 7/1992 | Remo | 423/446 |
| 5,204,144 A | 4/1993 | Cann et al. | 427/569 |
| 5,204,145 A | 4/1993 | Gasworth | 427/577 |
| 5,226,383 A | 7/1993 | Bhat | 118/730 |
| 5,256,205 A | 10/1993 | Schmitt, III et al. | 118/723 MW |
| 5,318,801 A | 6/1994 | Snail et al. | 427/248.1 |
| 5,342,660 A | 8/1994 | Cann et al. | 427/577 |
| 5,435,849 A | 7/1995 | Cann et al. | 118/723 R |
| 5,474,642 A | 12/1995 | Zorina et al. | 118/723 ER |
| 5,487,787 A | 1/1996 | Cann et al. | 118/723 R |
| 5,551,983 A | 9/1996 | Shepard, Jr. et al. | 118/723 R |
| 5,716,500 A | 2/1998 | Bardos et al. | 118/723 E |

DIAMOND FILM DEPOSITION ON SUBSTRATE ARRAYS

This is a divisional of U.S. application Ser. No. 08/870, 604 filed Jun. 6, 1997, now U.S. Pat. No. 6,173,672 claims priority from U.S. Provisional Patent Application No. 60/019,472, filed Jun. 10, 1996.

FIELD OF THE INVENTION

This invention relates to deposition of diamond film on substrate arrays.

BACKGROUND OF THE INVENTION

Techniques have long been known for depositing substances, such as layers of semiconductor material, using a plasma that is formed into a jet. For example, U.S. Pat. Nos. 4,471,003 and 4,487,162 disclose arc jet plasma deposition equipments which utilize a plasma for deposition of semiconductors and other materials. Ions and electrons are obtained by injecting an appropriate compound, such as a silicon compound, into an arc region, and a jet (or beam) is formed by utilizing magnetic fields to accelerate and focus the plasma. In recent years, equipment of this type has been used to deposit synthetic diamond. Superior physical and chemical properties make diamond desirable for many mechanical, thermal, optical and electronic applications, and the ability to deposit synthetic diamond by plasma jet deposition holds great promise, particularly if plasma jet techniques can be improved for this and other purposes. A plasma containing hydrocarbon radicals and atomic hydrogen can be obtained using electrical arcing, and the resultant plasma focused and accelerated toward a substrate so that polycrystalline diamond film is deposited on the substrate. Reference can be made, for example, to U.S. Pat. No. 5,204,144, assigned to the same assignee as the present Application, for description of an example of a type of plasma jet deposition that can be utilized to deposit synthetic diamond on a substrate.

In various commercial applications it is desirable to have relatively large size diamond films. In plasma jet deposition techniques there are various factors which limit the practical size of the deposition area that is active on a substrate at a particular moment. For example, when an arc is employed to generate the heated gas mixture in an arc jet plasma deposition system, the diameter of the beam can be limited by a number of factors. Since the cross-section of the plasma beam is generally limited in practical applications, the area on which it is desired to deposit a diamond film may be larger than the deposition beam. This means that it may be desirable to move the beam and the target substrate with respect to each other during the deposition process. This has been achieved by spinning the substrate during deposition, which helps to promote temperature uniformity over the substrate, as well as to attain larger area substrate coverage (see e.g. the referenced U.S. Pat. No. 5,204,144). Reference can also be made to U.S. Pat. Nos. 5,342,660, 5,435,849, 5,487,787, and 5,551,983, and to U.S. patent application Ser. No. 08/480,580.

In the typical DC plasma assisted CVD diamond deposition process, a DC arc jet is used to produce activated species of gases, often atomic hydrogen and hydrocarbons. These activated species are caused to flow over a substrate which is maintained at appropriate conditions of temperature and pressure to foster the deposition of polycrystalline diamond film. The percentage of the activated gas species that is engaged into the actual deposition process at the substrate surface is called the capture efficiency. This percentage is often quite low, such as under 50%, particularly when a single flat substrate surface is used.

In such cases, much of the activated gas species does not flow directly over the deposition surface, but is lost as overspray, diverted over the sides of the substrate, or does not penetrate the gas boundary layer which covers the substrate surface and hence is not available to participate in the actual film deposition process.

A second problem with single flat substrates is the non-uniformity of thickness of the deposited film, due to non-uniform gas conditions over the entire area of the substrate. Uniformity can be improved by methods such as those described in the above-referenced U.S. Patents and Application. There are limits, however, to the size of single diamond films which can be properly deposited because the properties of the gas change as the relative amounts of atomic hydrogen and activated carbon species in the plasma beam are depleted by deposition and by losses. For similar reasons, the relative quality of the deposited film is also subject to variation across the diameter (or linear dimension) of the substrate. Particularly, the amount and relative percentage of atomic hydrogen in the gas mixture tends to decrease as the gas continues to flow across the deposition surface. This can result in a undesirable change in the quality and growth rate of the diamond material.

It is among the objects of the present invention to provide improvements in plasma beam deposition of diamond film. It is also among the objects of the present invention to provide improved substrate arrays and techniques using such arrays in diamond film deposition.

SUMMARY OF THE INVENTION

The subject invention utilizes a plurality of deposition surfaces in a manner which: (1) improves the capture efficiency, which produces more diamond per amount of activated gas species; (2) improves the uniformity of activated gas species over the area of the individual substrates and among all of the substrate elements in the array, in order to improve the uniformity of thickness of the diamond film over the entire surface of each substrate element in the array, and among all elements in the array; and (3) improves the uniformity of activated gas species and the uniformity of the ratio of atomic hydrogen to activated hydrocarbon over the entire surface of each element, and uniformity among all substrate elements in the array, which tends to increase both the absolute quality and uniformity of quality of the deposited films.

One of the objectives hereof is to reduce the amount of atomic hydrogen wasted. Arc jet plasma jet diamond film deposition systems can be operated at low enough pressures (<50 torr) that recombination in the gas phase is not an important loss mechanism for atomic hydrogen. However, hydrogen atoms are wasted when they recombine in some position other than on a part of the growing diamond that eventually ends up in a useful application, and the loss can be quite significant.

Enhancing the efficiency of gas capture will generally lead to larger substrate surface area for diamond film deposition. Increases in monolithic film size, however, normally leads to increases in yield losses from broken diamond as well as lifting prior to scheduled run completion. Broken diamond is even more likely as the thickness of the film decreases. Post deposition processing of production volumes will require standardized coupons (individual diamond film segments) for cost effective, automated manufacturing. In addition, advanced substrate systems will likely require three dimensional mandrel surfaces from which flat films are produced. These constraints all illustrate the desirability of employing segmented substrate surfaces in which the deposition area is divided into numerous standard sub-regions, sized to maximize the yield of unbroken diamond coupons.

The fact that carbon species both diffuse more slowly and are consumed at the substrate surface less efficiently than atomic hydrogen results in a gas stream which is decreasing in its ratio of atomic hydrogen to carbon as it flows along the surface of a substrate. For this reason the quality of the diamond deposited will decrease along the gas flow path in any substrate system which attempts to utilize only a long gas path to increase the usage of active species. In addition, the overall fraction of active species will decrease along the gas path, leading to reduced growth rates at the extremes of the substrate system. Therefore, in order to deposit uniform diamond films with efficient utilization of gas species one must take steps to ensure that all deposition surfaces receive similar exposure to the gas stream of the plasma beam. Two approaches hereof which help in achieving the stated objective are as follows: (1) moving of substrate surfaces such that all locations receive a similar time averaged exposure to the gas stream; and (2) design of substrate array geometry such that all surface locations experience a gas flow with substantially the same nominal deposition potential.

In accordance with one form of the invention, there is disclosed a method of depositing diamond film on a plurality of substrates, which comprises the following steps: providing a plasma beam containing atomic hydrogen and a carbonaceous component; providing a plurality of substrates, each of the substrates having a deposition surface, the substrates being arranged such that the beam impinges successively on a deposition surface of a first of the substrates and then on a deposition surface of a second of said substrates; the deposition surfaces of the first and second substrates being oriented with respect to each other at a non-zero angle. In a preferred embodiment of this form of the invention, the deposition surfaces are planar surfaces, and the non-zero angle is at least 10 degrees. The beam impingement on the deposition surface of the second substrate results in a reduction in boundary layer between beam and deposition surface.

In accordance with a further form of the invention, there is disclosed a method of depositing diamond film on a plurality of substrates, comprising the following steps: providing a plasma beam containing atomic hydrogen and a carbonaceous component; providing several substrates having respective deposition surface petals arranged in a symmetrical concave array; rotating the array; and directing the beam at a portion of the array, so that during rotation of the array, the surface petals are successively positioned for direct impingement by the beam. In a preferred embodiment of this form of the invention, the step of directing the beam comprises directing the beam substantially off axis with respect to the axis of symmetry of the symmetrical concave array. [As used herein, substantially off axis means that the beam center is offset from the axis of symmetry of the array by at least 25 percent of the array outer diameter.] In this embodiment, the beam directly impinges on no more than half of the surface petals at any time. The rotation of the array exposes all petals of the array to substantially the same time averaged flux of the atomic hydrogen and carbonaceous component of the beam.

Further features and advantages of the invention will become more readily apparent from the following detailed description when taken in conjunction with the accompanying drawings.

DETAILED DESCRIPTION

Figure 1:
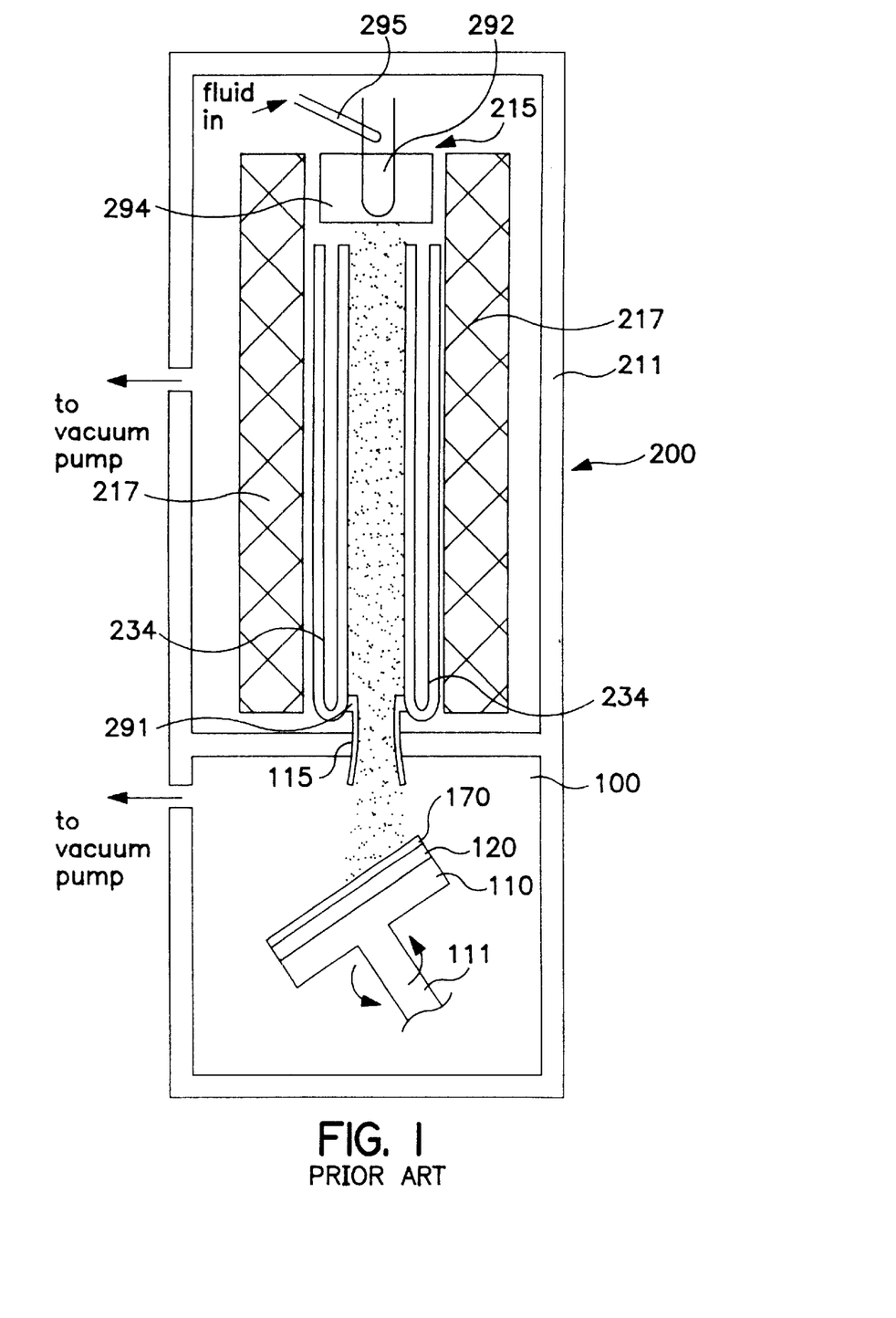
FIG. 1 is a cross-sectional diagram, partially in schematic form, of an apparatus for plasma jet chemical vapor deposition of a type that can be utilized in practicing embodiments of the invention.

Referring to FIG. 1, there is shown a chemical vapor deposition ("CVD") apparatus of a type which can be utilized in practicing embodiments of the invention. A deposition chamber 100 is the lower section of a plasma jet CVD deposition system 200, evacuated by one or more vacuum pumping systems (not shown).

The system 200 is contained within a vacuum housing 211 and includes an arc-forming section 215 which comprises a cylindrical holder 294, a rod-like cathode 292, and an injector 295 mounted adjacent to the cathode so as to permit injected fluid to pass over the cathode. A cylindrical anode is provided at 291. In the illustrated system, where synthetic diamond is to be deposited, the input fluid may be, for example, a mixture of hydrogen and methane. The methane could alternatively be fed in downstream. The anode 291 and cathode 292 are energized by a source of electrical power (not shown), for example a DC potential. Cylindrical magnets, designated by reference numeral 217, are utilized to help control the plasma generation. A nozzle, represented at 115, can be used to control beam size, within limitations. Optional cooling coils 234, in which a coolant can be circulated, can be located within the magnets.

In an example of operation, a mixture of hydrogen and methane is fed into the injector 295, and a plasma is obtained in front of the arc forming section and accelerated and focused toward the deposition region at which a substrate is located. As is known in the art, synthetic polycrystalline diamond can be formed from the described plasma, as the carbon in the methane is selectively deposited as diamond, and the graphite which forms is dissipated by combination with the hydrogen facilitating gas. For further description of plasma jet deposition systems, reference can be made to U.S. Pat. Nos. 4,471,003, 4,487,162, and 5,204,144.

In the prior art system of FIG. 1, a mandrel 110 is rotatable on a shaft 111, and has a spacer 120 and a substrate 170 mounted thereon (by means not shown, bolting or clamping being typical). The mandrel 110 can be cooled by any suitable means, for example by using a heat exchange fluid (e.g. water) that is circulated through the mandrel. The mandrel can be tilted with respect to the direction of the plasma jet, as disclosed in U.S. Pat. No. 5,342,660. The heat exchange fluid can, for example, be fed and returned through a rotary union, and a suitable motor (not shown) can be used for rotating the shaft, as is also disclosed in U.S. Pat. No. 5,342,660. The rotational drive will conventionally be above the rotary union.

Figures 2, 3:
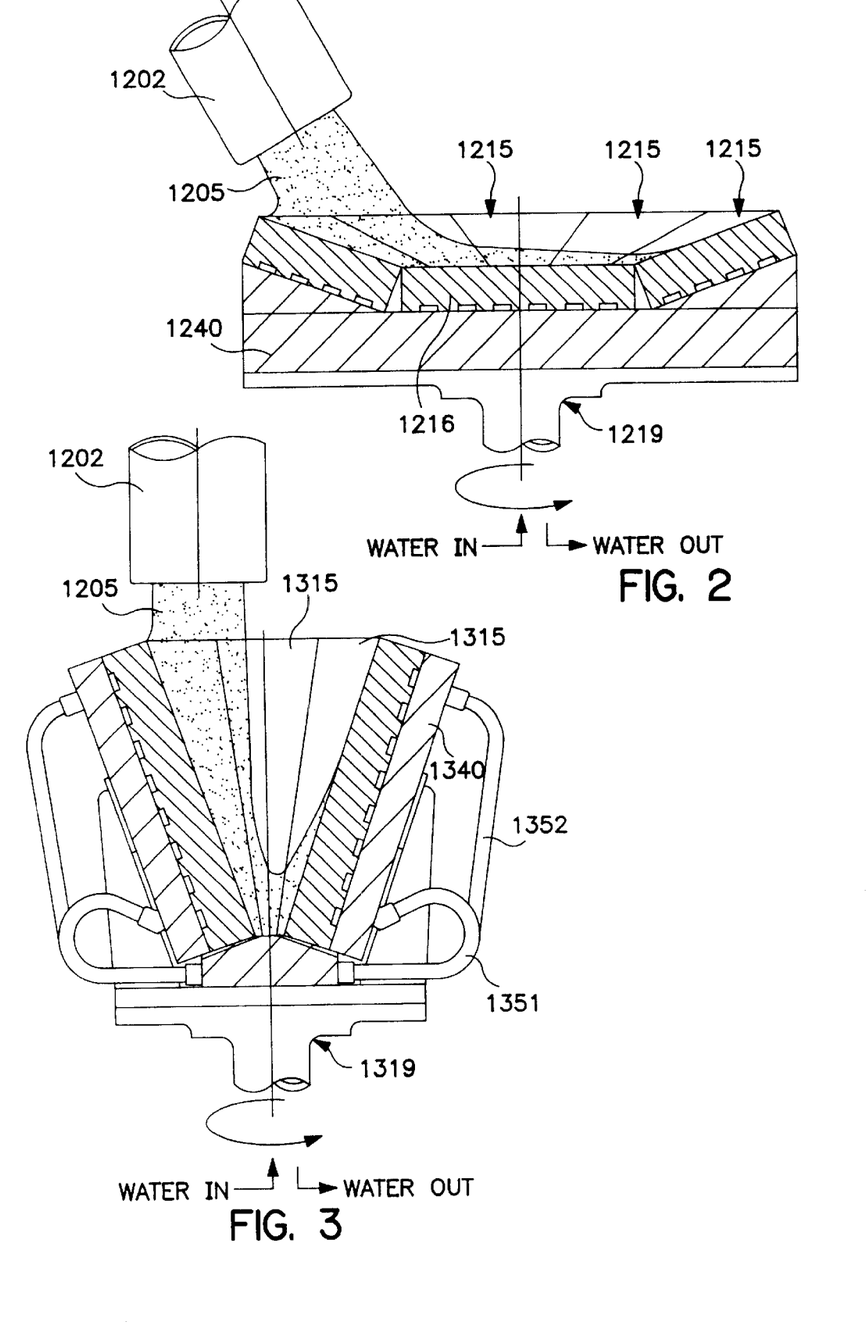
FIG. 2 is a diagram, partially in cross-sectional form and partially in schematic form, of an embodiment of a substrate array that can be utilized in practicing a form of the invention.
FIG. 3 is a diagram, partially in cross-sectional form and partially in schematic form, of another embodiment of a substrate array that can be utilized in practicing a form of the invention.

FIG. 2 shows a plasma beam 1205 from an arc jet processor 1202 (as in FIG. 1), but with an array of several (at least three, and preferably more) substrates 1215 with deposition surfaces (or "surface petals") arranged in a symmetrical concave array. In the example of FIG. 2, the surface petals are trapezoidal in shape, and there are eight surface petals in the array (only half the array being visible in the cross-section of the Figure). The substrates are mounted in a cooled mandrel or plate 1240, which is suitably dish-shaped in this embodiment, and can be water cooled as previously described. Also, as described in the above-referenced U.S. Patents and Application, gas gap or slotted interface can be used to assist in temperature control. Rotation of spinning base 1219 is preferably to at least 1000 RPM. The beam 1205 is offset from the axis of symmetry (and rotational axis) of the array. In this case the offset is both linear and angular. In the embodiment of FIG. 2, a central substrate 1216 has a regular octagonal shape and is in a plane that is at an angle of at least 10 degrees (and preferably greater) with respect to the planar surfaces of the petals. This facilitates establishment of renewed boundary layer as the beam impinges directly first on one (or two) petal surfaces, and then has subsequent impingements on other surfaces (e.g. 1216 and then opposing petals of the concave array). The spinning of the array facilitates receipt by the different surfaces of a similar time averaged exposure to the constituents of the gas stream (e.g. the useful carbon-containing radicals and atomic hydrogen).

In the FIG. 3 embodiment the offset of beam 1205 from the spinning axis (and symmetry axis) is linear, and triangular surface petals of the substrates 1315 form a generally conical array. In this Figure, the cooled mandrel 1340 is shown in conjunction with tubes 1351 and 1352 to handle the heat exchange fluid. The spinning base is represented at 1319.

Figure 4:
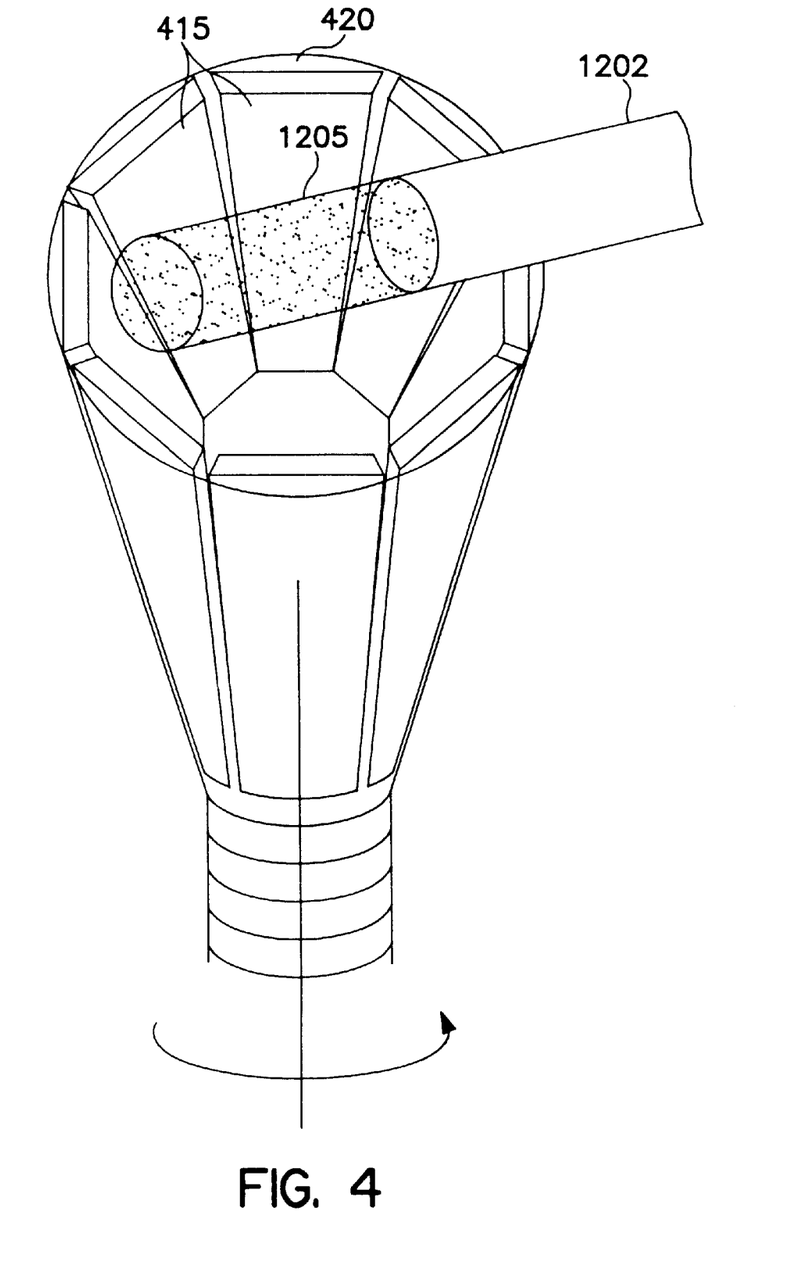
FIG. 4 is a simplified diagram showing an embodiment of another array and deposition configuration that can be used in practicing a form of the invention.

FIG. 4 shows a further configuration of a generally conically shaped array with substrate petals 415, and an impinging plasma beam 1205 from source 1202. It can be noted that centrifugal force helps keep film and substrate (or holders in substrates, not shown) in place during deposition, such as against outer envelope 420.

Figure 5:
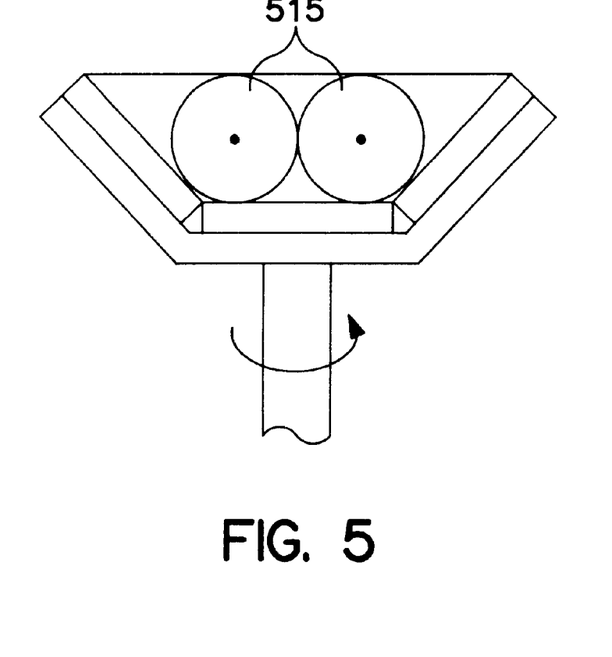
FIG. 5 is a cross-sectional view of an embodiment of another substrate array that can be utilized in practicing a form of the invention.
Figure 6:
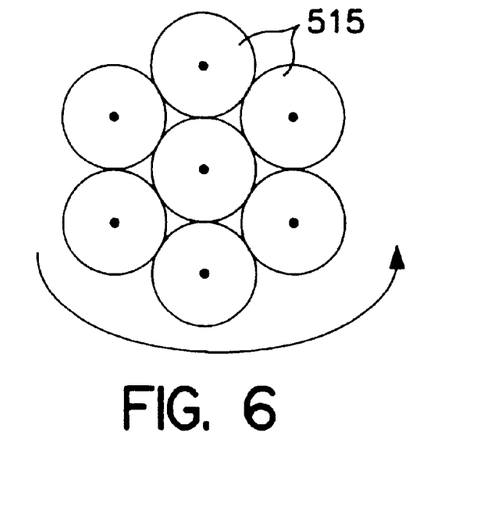
FIG. 6 shows a plan view of substrates of the FIG. 5 embodiment.
Figure 7:
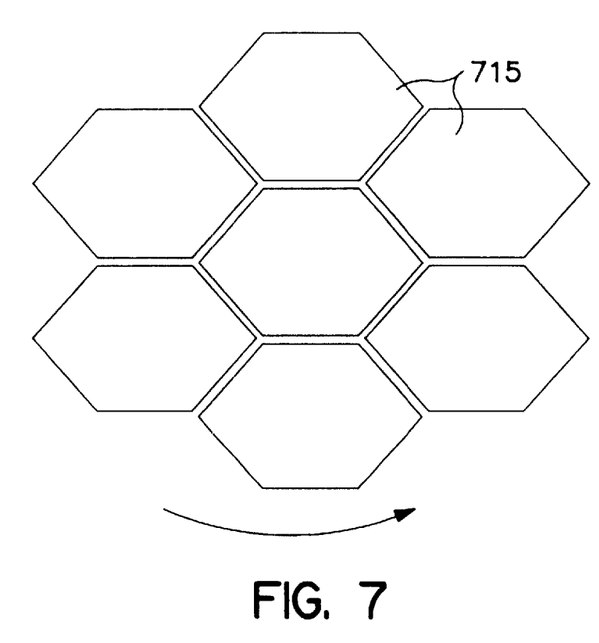
FIG. 7 shows a plan view of substrates in accordance with a still further embodiment of the invention.
Figure 8:
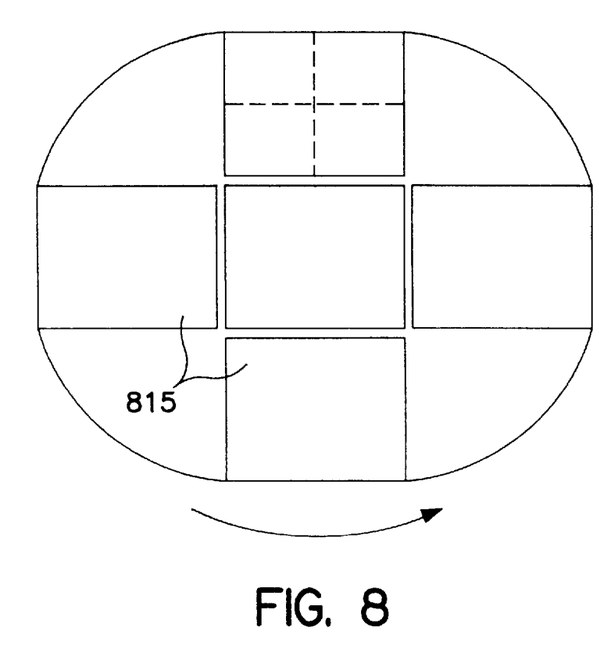
FIG. 8 shows a plan view of a still further array of substrates in accordance of an embodiment of the invention.

FIGS. 5 and 6 show configurations with circular surface petals 515, and FIG. 7 shows hexagonal surface petals. The FIG. 5 illustration includes the rotatable base that can be cooled. Also, in addition to the spinning of the entire array, the substrates of FIG. 5 can have planetary rotation, implemented such as by appropriate gearing. FIG. 8 shows rectangular surface petals 815, with division of each petal surface into product size, as shown in dashed line on one of the petals.

Figure 9:
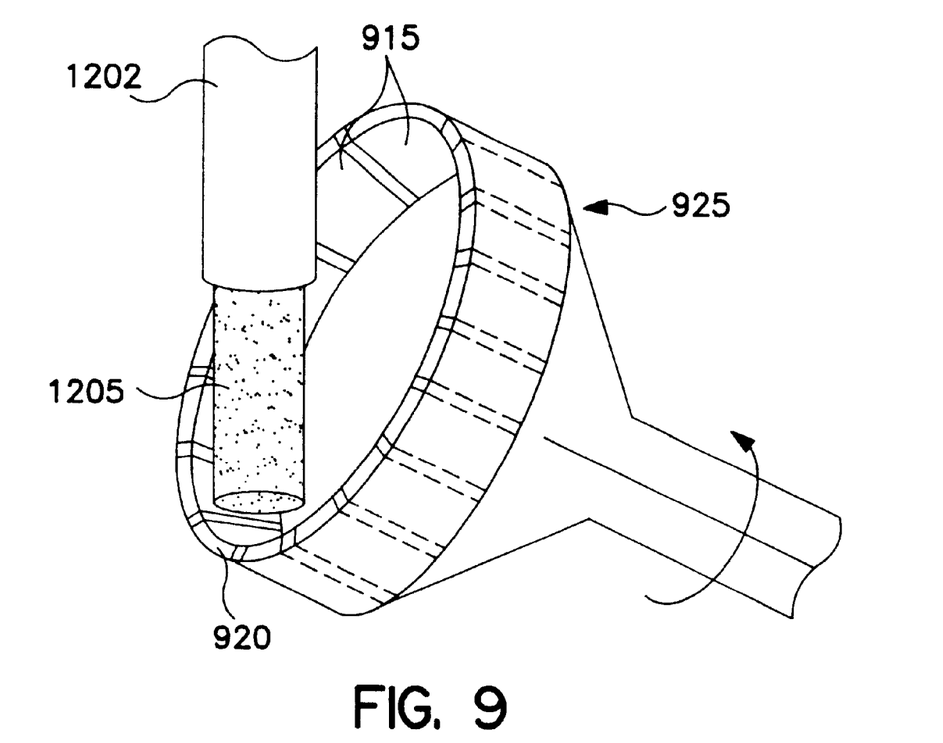
FIG. 9 is a simplified diagram showing an embodiment of another array and deposition configuration that can be used in practicing a form of the invention.

FIG. 9 shows an array with generally rectangular surface petals 915 on the interior of a cylindrical spinner 925. Again, centrifugal force can be used to advantage, such as against outer envelope 920.

Figure 10:
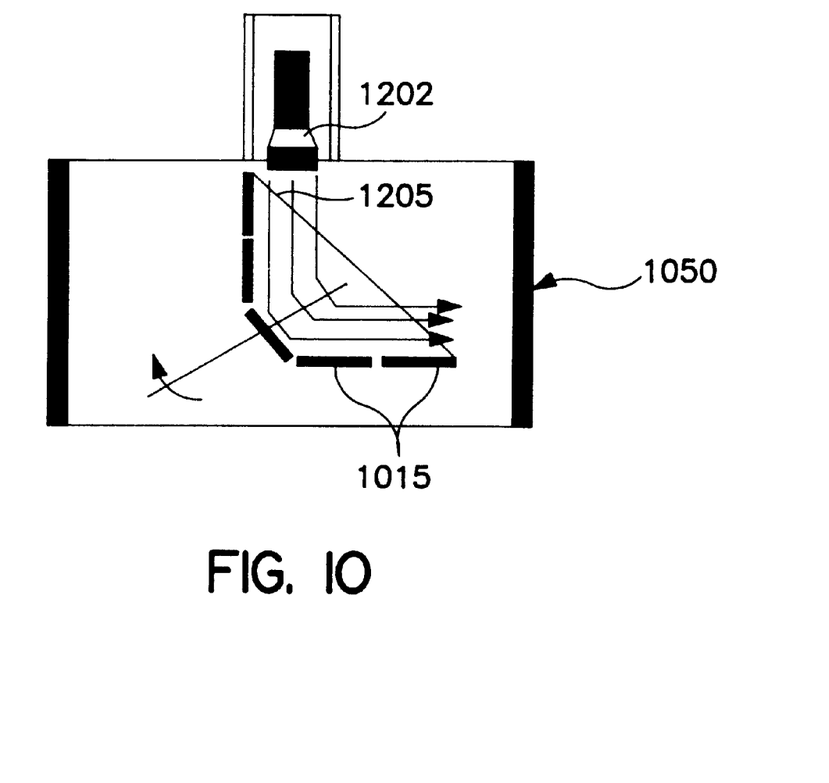
FIG. 10 is a cross-sectional diagram, partially in schematic form, of a further substrate array and deposition configuration in accordance with an embodiment of the invention.

In FIG. 10, the substrate surface is comprised of many segments 1015 in the shape of a cone, shown inside a vacuum chamber 1050. The beam 1205 from source 1202 enters approximately parallel to the cone's flared surface. The shape provides a long gas path to maximize the utilization of active gas species. The cone rotates rapidly about its axis (as represented by the curved arrow) so the outermost segments alternate between seeing the most depleted gas and the freshest gas from the plasma beam. The more central segments are exposed to gas which is an average of the two extremes. An iterative experimental approach can be used to optimize the substrate geometry.

Figure 11:
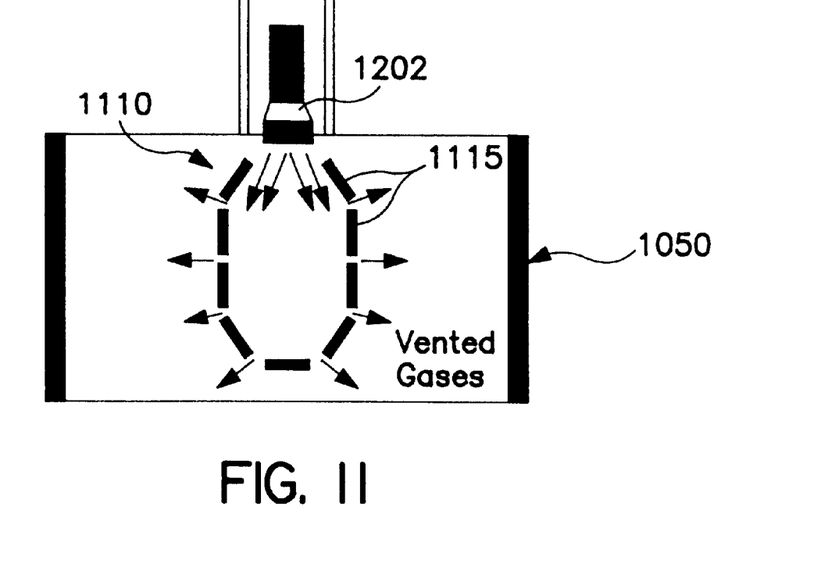
FIG. 11 is a cross-sectional diagram, partially in schematic form, of a further substrate array and deposition configuration in accordance with an embodiment of the invention.

In FIG. 11, a large area "mandrel chamber" is provided within which all segments 1115 experience similar exposure to the gas flow. Gas is vented from the chamber between segments 1115 at numerous distributed locations.

What is claimed is:

1. A method of depositing diamond film on a plurality of substrates, comprising the steps of:

providing a plasma beam containing atomic hydrogen and a carbonaceous component;

providing a plurality of substrates, each of said substrates having a deposition surface, said substrates being arranged such that said beam impinges successively on a deposition surface of a first of said substrates and then on a deposition surface of a second of said substrates;

said deposition surfaces of said first and second substrates being oriented with respect to each other at a non-zero angle.

2. The method as defined by claim 1, wherein said deposition surfaces are planar surfaces, and wherein said non-zero angle is at least 10 degrees.

3. The method as defined by claim 1, wherein, after impinging on the planar deposition surfaces of said first and second substrates, said beam subsequently impinges on a deposition surface of a third of said substrates, the deposition surfaces of said second and third substrates being oriented with respect to each other at a further non-zero angle.

4. The method as defined by claim 2, wherein, after impinging on the planar deposition surfaces of said first and second substrates, said beam subsequently impinges on a planar deposition surface of a third of said substrates, the planar deposition surfaces of said second and third substrates being oriented with respect to each other at a further non-zero angle.

5. The method as defined by claim 4, wherein said further non-zero angle is at least 10 degrees.

6. The method as defined by claim 1, wherein said beam impingement on said deposition surface of said second substrate results in a reduction in boundary layer between the beam and deposition surface.

7. The method as defined by claim 2, wherein said beam impingement on said deposition surface of said second substrate results in a reduction in boundary layer between the beam and deposition surface.

8. A method of depositing diamond film on a plurality of substrates, comprising the steps of:

providing a plasma beam containing atomic hydrogen and a carbonaceous component;

providing several substrates having respective deposition surface petals arranged in a symmetrical concave array;

rotating the array; and directing the beam at a portion of the array, so that during rotation of said array, said surface petals are successively positioned for direct impingement by said beam.

9. The method as defined by claim 8, wherein said step of directing said beam comprises directing said beam substantially off axis with respect to the axis of symmetry of said symmetrical concave array.

10. The method as defined by claim 9, wherein said beam directly impinges on no more than half of the surface petals at any time.

11. The method as defined by claim 10, wherein said surface petals are trapezoidal in shape.

12. The method as defined by claim 10, wherein said surface petals are triangular in shape.

13. The method as defined by claim 10, wherein said surface petals are rectangular in shape.

14. The method as defined by claim 10, wherein said surface petals are hexagonal in shape.

15. The method as defined by claim 10, wherein said surface petals are circular in shape.

16. The method as defined by claim 10, wherein the majority of said beam can directly impinge on one of said surface petals at a given time.

17. The method as defined by claim 10, wherein, after said direct impingement, said beam has a further impingement on other surface petals of said array.

18. The method as defined by claim 17, wherein said rotation exposes all petals of said array to substantially the same time averaged flux of said atomic hydrogen and carbonaceous component of said beam.

* * * * *